(12) United States Patent
Saketi

(10) Patent No.: US 11,219,151 B1
(45) Date of Patent: Jan. 4, 2022

(54) PICKUP HEAD WITH TOUCH DOWN SENSOR

(71) Applicant: Facebook Technologies, LLC, Menlo Park, CA (US)

(72) Inventor: Pooya Saketi, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 413 days.

(21) Appl. No.: 16/370,771

(22) Filed: Mar. 29, 2019

Related U.S. Application Data

(60) Provisional application No. 62/650,884, filed on Mar. 30, 2018.

(51) Int. Cl.
```
H05K 13/08    (2006.01)
H05K 13/04    (2006.01)
H01L 21/67    (2006.01)
H01L 33/00    (2010.01)
```
(52) U.S. Cl.
CPC ..... *H05K 13/082* (2018.08); *H01L 21/67144* (2013.01); *H01L 33/005* (2013.01); *H05K 13/0408* (2013.01); *H05K 13/0478* (2013.01); *H05K 13/0882* (2018.08); *Y10T 29/4913* (2015.01); *Y10T 29/53178* (2015.01)

(58) Field of Classification Search
CPC ............ H01L 21/67144; H05K 13/048; H05K 13/0478; H05K 13/082; Y10T 29/4913; Y10T 29/53178
See application file for complete search history.

(56) References Cited

U.S. PATENT DOCUMENTS

2014/0169924 A1* 6/2014 Golda ................... H01L 25/167
414/752.1

* cited by examiner

*Primary Examiner* — Livius R. Cazan
(74) *Attorney, Agent, or Firm* — Fenwick & West LLP

(57) ABSTRACT

To manufacture a device by picking and placing semiconductor devices from a carrier substrate to a target substrate using touch down sensors, a pick-up head including touch down sensors and the semiconductor devices on the carrier substrate are moved relative to each other to contact the carrier substrate with the touch down sensors. Signals from each touch down sensor indicating a degree of deformation of each touch down sensor caused by the contact with the carrier substrate are used to determine an orientation of the pick-up head by processing the signals, and adjust the orientation of the pick-up head based on the determined orientation to attach the semiconductor devices onto the pick-up head. In some embodiments, the touch down sensors are piezoelectric benders.

20 Claims, 10 Drawing Sheets

PICKUP HEAD WITH TOUCH DOWN SENSOR

CROSS REFERENCE TO RELATED APPLICATION

The application claims the benefit of U.S. Provisional Patent Application No. 62/650,884, filed Mar. 30, 2018, which is incorporated by reference in its entirety.

BACKGROUND

The present disclosure relates to a sensor for a multi device pick-up head and manufacturing process for use in, but not exclusively limited to, pick and place of very small display element(s) from an initial substrate to a receiving substrate using a pick-up and transfer process.

To populate a display with very small light emitting diodes (LEDs), such as micro-LEDs, there may be a need to transfer the LEDs from the native substrate on which they have been manufactured to a target substrate that forms part of a display, or "display substrate." Such small semiconductor devices may be assembled with a defined separation distance between them or closely packed together on the target substrate. Because of the small size of these devices (e.g., smaller than 40×40 μm), conventional pick and place techniques are unsuitable.

SUMMARY

Embodiments relate to setting the orientation of a pick-up head for small semiconductor devices, such as micro-light emitting diodes (mLEDs) or vertical-cavity surface-emitting lasers (VCSELs), using a touch down sensors on the pick-up head.

Some embodiments include picking and placing a semiconductor device with a pick-up head using touch down sensors. The pick-up head is aligned with semiconductor devices on a carrier substrate. The pick-up head includes touch down sensors at a surface of the pick-up head facing the carrier substrate. After alignment, the pick-up head is moved relative to the semiconductor devices on the carrier substrate to contact the carrier substrate with the touch down sensors. Signals are received from each touch down sensor indicating a degree of deformation of each touch down sensor caused by the contact with the carrier substrate, and determining an orientation of the pick-up head by processing the signals. The orientation of the pick-up head is adjusted based on the determined orientation to attach the semiconductor devices onto the pick-up head. After attachment, the pick-up head is separated from the carrier substrate with the semiconductor devices attached to the pick-up head. Similarly, the touch down sensors may be used to adjust orientation of the pick-up head to place the semiconductor devices attached to the pick-up head on a target substrate.

Some embodiments include a pick-up head and a controller. The pick-up head includes a body portion defining a surface, an array of tips on the surface to attach with semiconductor devices on a carrier substrate, and touch down sensors on the surface and that deform in response to a contact. The processor executes instructions to control the position of the pick-up head based on signals received from the touch down sensors indicating a degree of deformation caused by contact during pick and place operations.

The figures depict embodiments of the present disclosure for purposes of illustration only.

DETAILED DESCRIPTION

Embodiments relate to the picking and placing of an array of semiconductor devices, such as light emitting diodes (LEDs) or VCSELs, using a pick-up head including touch down sensors for tip-tilt compensation between the pick-up head and the array of semiconductor devices. The touch down sensors may include piezoelectric benders that deform in response to contact, with the degree of deformation resulting in different signals being generated by the piezoelectric benders. The signals from the piezoelectric benders are analyzed to adjust the position, such as the orientation along rotational degrees of freedom, of the pick-up head during pick and place operations for the semiconductor devices. Among other advantages, the accuracy of alignment of the pick-up head is improved for small semiconductor devices where optical alignment techniques may be insufficiently precise.

Fabrication System Overview

Figure 1:
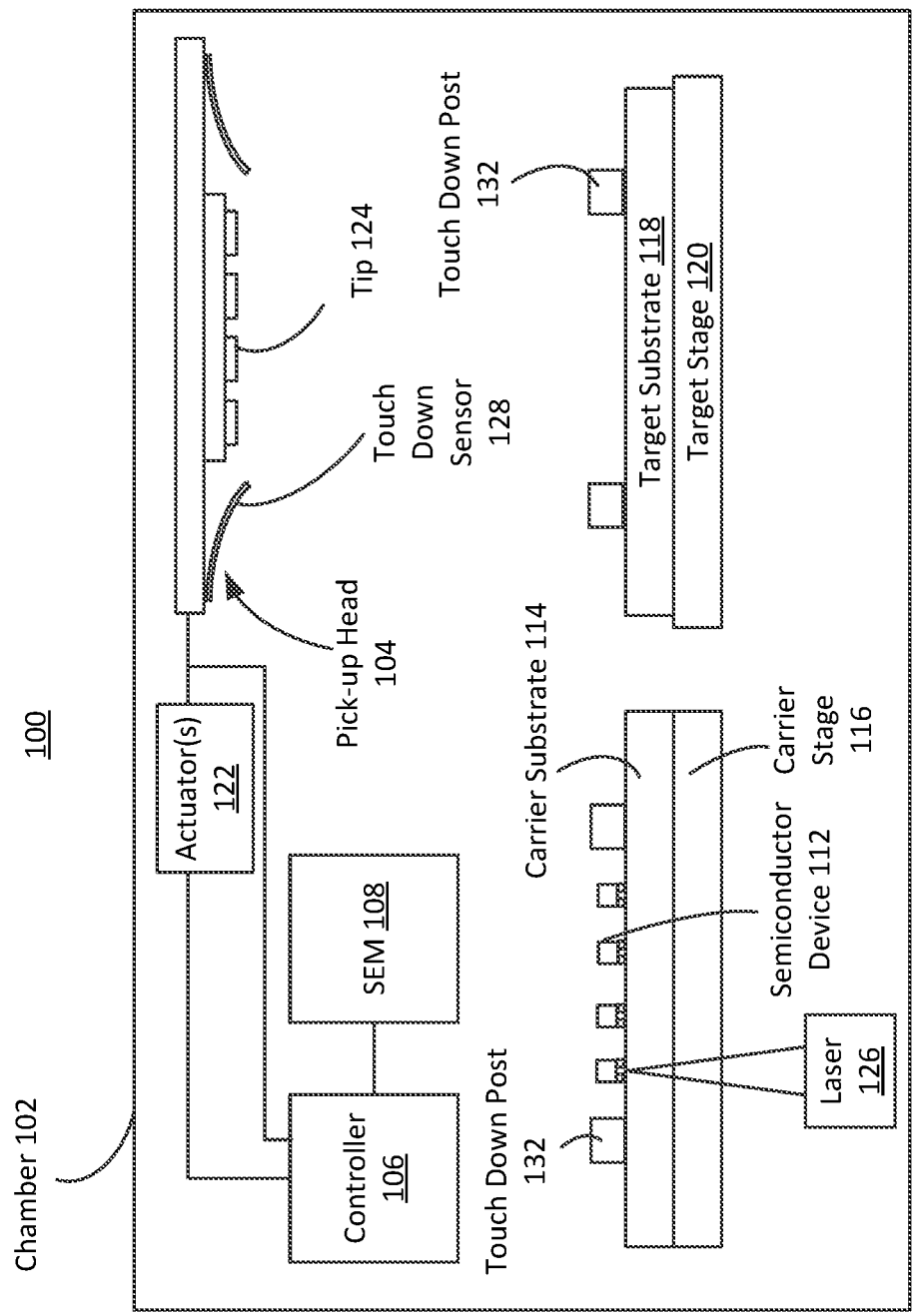
FIG. 1 is schematic diagram illustrating a display fabrication system, in accordance with one embodiment.

FIG. 1 is a block diagram illustrating a display fabrication system 100, in accordance one embodiment. The system 100 fabricates an electronic display by assembling semiconductor devices 112 from a carrier substrate 114 to a target substrate 118. The carrier substrate 114 holds the semiconductor devices 112 for pick up by the pick-up head 104. The target substrate 118 may be a display substrate, or may be an intermediate carrier substrate that facilitates bonding with a display substrate. The system 100 places the semiconductor devices 112 at pixel locations of the display substrate, and then bonds the semiconductor devices 112 to the display substrate. In some embodiments, the semiconductor devices 112 are micro-LEDs. The feature size of the micro-LEDs may range from sub-micrometers to tens of micrometers (e.g., from 0.1 μm to 10 μm). Multiple micro-LEDs may form an array on the display substrate, with the pitch (e.g., spacing between micro-LEDs) ranging from sub-micrometers to tens of micrometers. In other embodiments, the semiconductor devices are VCSELs, or other types of light emitting devices. The system 100 provides accurate alignment for simultaneous pick and place of multiple selected semiconductor devices of small size, but can be used to assemble other types of semiconductor devices.

The system 100 may include, among other components, a scanning electron microscope (SEMS) chamber 102 defining an interior environment for picking and placing semiconductor devices 112 within the SEM chamber 102. The system 100 further includes a pick-up head 104, a scanning electron microscope (SEM) 108, an actuator 122, a carrier stage 116, a target stage 120, and a dicing laser 126. The carrier stage 116 holds a carrier substrate 114 having semiconductor devices 112. The target stage 120 holds a target substrate 118 to receive some or all of the semiconductor devices 112 from the carrier substrate 114, such as a selected subset of the semiconductor devices on the carrier substrate 114. A controller 106 is coupled to the SEM 108 and the pick-up head 104 (e.g., via the actuator 122) to control the operations of the SEM 108 and pick-up head 104. For example, the controller 106 causes the pick-up head 104 to pick up one or more semiconductor devices 112 located on a carrier substrate 114, and place the one or more semiconductor devices on the target substrate 118. The controller 106 is further configured to control the alignment of the pick-up head 104 based on signals from touch down sensors 128 of the pick-up head 104. A touch down sensor may include a displacement sensor or a force sensor.

The pick-up head 104 may include, among other components, the touch down sensors 128 and an array of tips 124. In some embodiments, each tip 124 may be selectively controlled to pick up a semiconductor device 112 from the carrier substrate 114, and place the semiconductor device on the target substrate 118. The touch down sensors 128 deform during the pick and place operation, and provides signals to the controller 106 indicating the degree of deformation. The controller 106 processes the signals to determine an orientation (e.g., tip-tilt) of the pick-up head 104, and adjusts the orientation of the pick-up head 104 based on the determined orientation to attach the semiconductor devices 112 onto the tips 124 of the pick-up head 104. Feedback from touch down sensor readout may be used for compensating the tip-tilt of the pick-up head 104.

The actuator 122 is an electro-mechanical component that controls the movement of the pick-up head 104 based on instructions from the controller 106. For example, the actuator 122 may move the pick-up head 104 with up to six degrees of freedom including up and down, left and right, forward and back, yaw, pitch, and roll. The actuator 122 may be embodied, for example, as a rotating motor, a linear motor or a hydraulic cylinder.

The SEM 108 facilitates a visual alignment for semiconductor device pick-up from the carrier substrate 114, and alignment for semiconductor device placement on the target substrate 118. For example, the SEM 108 generates images of the pick-up head 104 and the carrier substrate 114, and provides the images to the controller 106. In some embodiments, the SEM 108 or some other visual sensor is used to perform an initial rough alignment including an orientation adjustment that is used to bring the pick-up head 104 toward semiconductor devices during pick up, and the touch down sensors 128 is used to perform a subsequent fine adjustment of the orientation to attach the semiconductor devices 112 onto the pick-up head 104. In some embodiments, the SEM 108 is an environmental scanning electron microscope (ESEM) to provide images without specimen coating, and the SEM chamber 102 is an ESEM chamber including a high pressure atmosphere of water vapor. In various embodiments, other types of imaging devices may be used to facilitate the alignment and orientation adjustment of the pick-up head 104.

The controller 106 controls the operation of the pick-up head 104. The controller 106 may selectively operate a subset of the tips 124 to attach a subset of the semiconductor devices 112 on the carrier substrate 114 to the tips 124 for a pick and place process. The controller 106 aligns the tips 124 of the pick-up head 104 with the carrier substrate 114 based on the signals from the touch down sensors 128, determines an orientation of the pick-up head from the signals, adjusts the orientation of the pick-up head 104 as needed to align with the semiconductor devices, causes the pick-up head 104 to pick up one or more semiconductor devices 112 mounted on the carrier substrate 114. The orientation adjustment may include rotating the pick-up head 104, such as rolling, pitching, or yawing the pick-up head 104, in manner that causes the array of tips 124 to be aligned with an array of semiconductor devices 112 to pick up of each of the devices in the array, and without causing damaging contact with any of the semiconductor devices 112 during the pickup. In some embodiments, the signals from the touch down sensors 128 are used to adjust the rotation of the pick-up head 104 by pitching or rolling the pick-up head until each of the signals from the touch down sensors 128 indicate the same degree of deformation.

Similarly for the target substrate or display substrate 118, the controller 106 aligns the tips 124 with the display substrate 118 based signals from the touch down sensors 128, and places the semiconductor devices 112 attached to the tips 124 on the display substrate 118 in a manner that causes the array of semiconductor devices 112 to be simultaneously placed on the display substrate 118, and without causing damaging contact with any of the semiconductor devices 112 during the placement.

In some embodiments, the carrier stage 116 and/or target stage 120 may be adjusted to facilitate precision alignment with the pick-up head 104. For example, the carrier stage 116 and/or target stage 120 may include three degrees of freedom. The degrees of freedom may include left and right, backward and forward, and a yaw rotational degree of freedom. The carrier substrate 114 may be moved with the carrier stage 116, and the display substrate 118 may be moved with the target stage 120. In alternative to or addition to adjusting the translational or rotational position of the pick-up head 104 to align the touch down sensors 128 and the tips 124, the translational or rotational position of the carrier substrate and target substrate may be adjusted according to the signals from the touch down sensors 128.

The system 100 may include one or more carrier substrates 114. For example, different carrier substrates 114 may carry different color LED dies. In some embodiment, the carrier substrate 114 may be carrier film that holds singulated semiconductor devices 112 for transfer to the display substrate 118. The carrier substrate 114 may include touch down posts 132 that are aligned with the touch down sensors 128 of the pick-up head 104. When the pick-up head 104 is moved toward the semiconductor devices 112 and touch down posts 132 on the carrier substrate (or alternatively the carrier substrate is moved), each touch down sensor 128 contacts a corresponding touch down post 132. Furthermore, the tips 124 of the pick-up head 104 are aligned with In some embodiments, some or all of the touch down posts 132 may be on the carrier stage 116.

The system may include one or more target substrates 118. In some embodiments, such as when the target substrate 118 is the display substrate for receiving the semiconductor devices 112, the target stage 120 includes a heater for thermal conductive bonding of the electrical contact pads of the semiconductor devices 112 to the display substrate 118 subsequent to placement of the semiconductor devices 112 on the display substrate 118 by the pick-up head 104. In other embodiments, the target substrate 118 is an intermediate carrier substrate that is used to facilitate direct bonding of the semiconductor devices 112 with a separate display substrate 118 (e.g., using a direct bonding process rather than transfer via suction force).

The laser 126 generates a laser beam to singulate the semiconductor devices 112 on the carrier substrate 114. Multiple semiconductor devices 112 may be fabricated on a native substrate and singulated on the carrier substrate 114. In some embodiments, the laser beam is directed through the carrier substrate 114. The carrier substrate 114 may include a carrier tape or other adhesive layer to hold the semiconductor devices 112 in place with an adhesion force. A laser beam may be used to reduce the adhesion force to facilitate pick up of the semiconductor devices 112 by the pick-up head 104. Selective pick-up of semiconductor devices 112 may include a reducing the adhesion force to selected semiconductor devices 112 on the carrier substrate 114. In some embodiments, the system 100 includes a mechanical dicer to singulate the semiconductor devices 112, such as a diamond based cutting wheel.

Figure 2A:
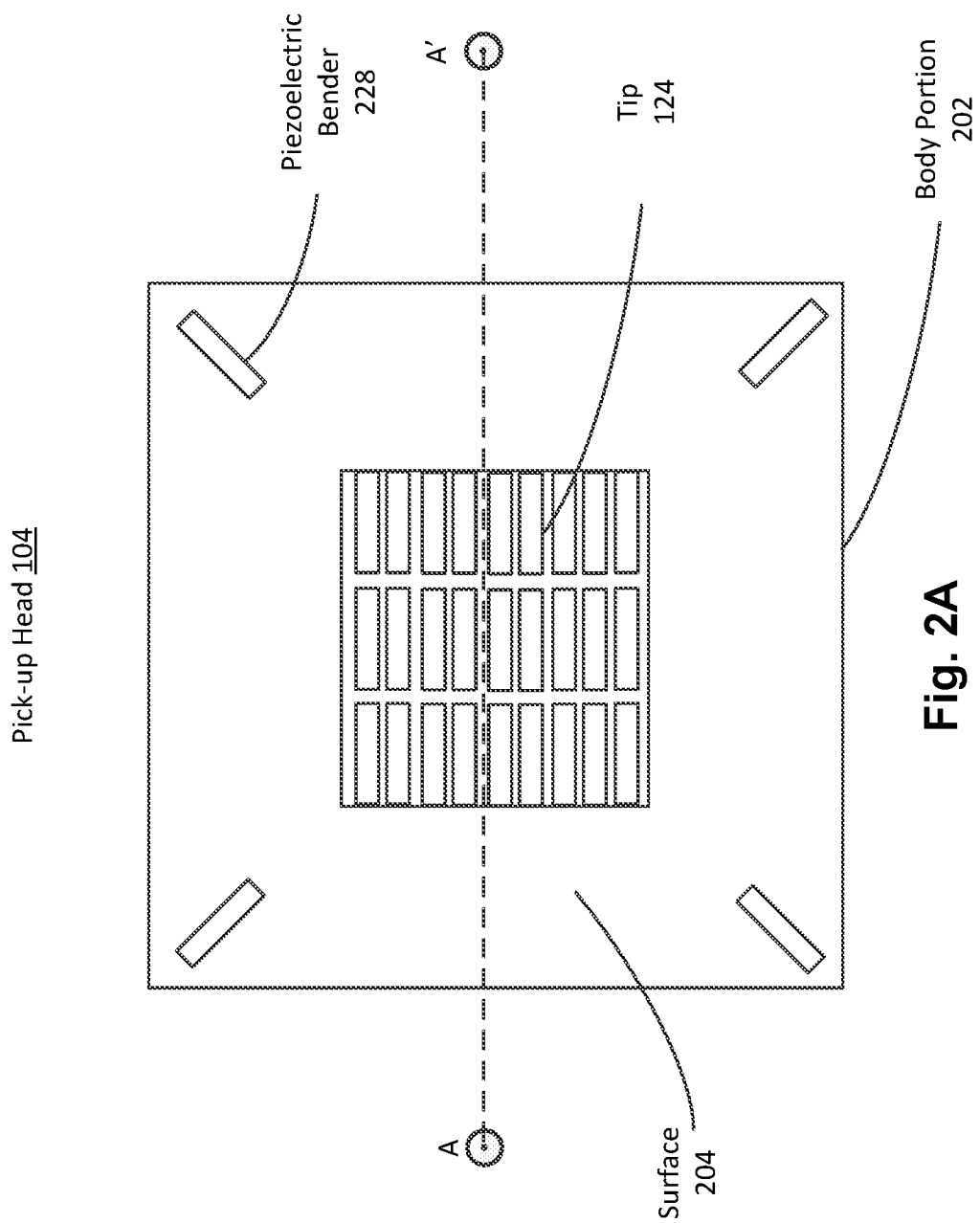
FIG. 2A is a bottom view of a pick-up head of the display fabrication system, in accordance with one embodiment.
Figure 2B:
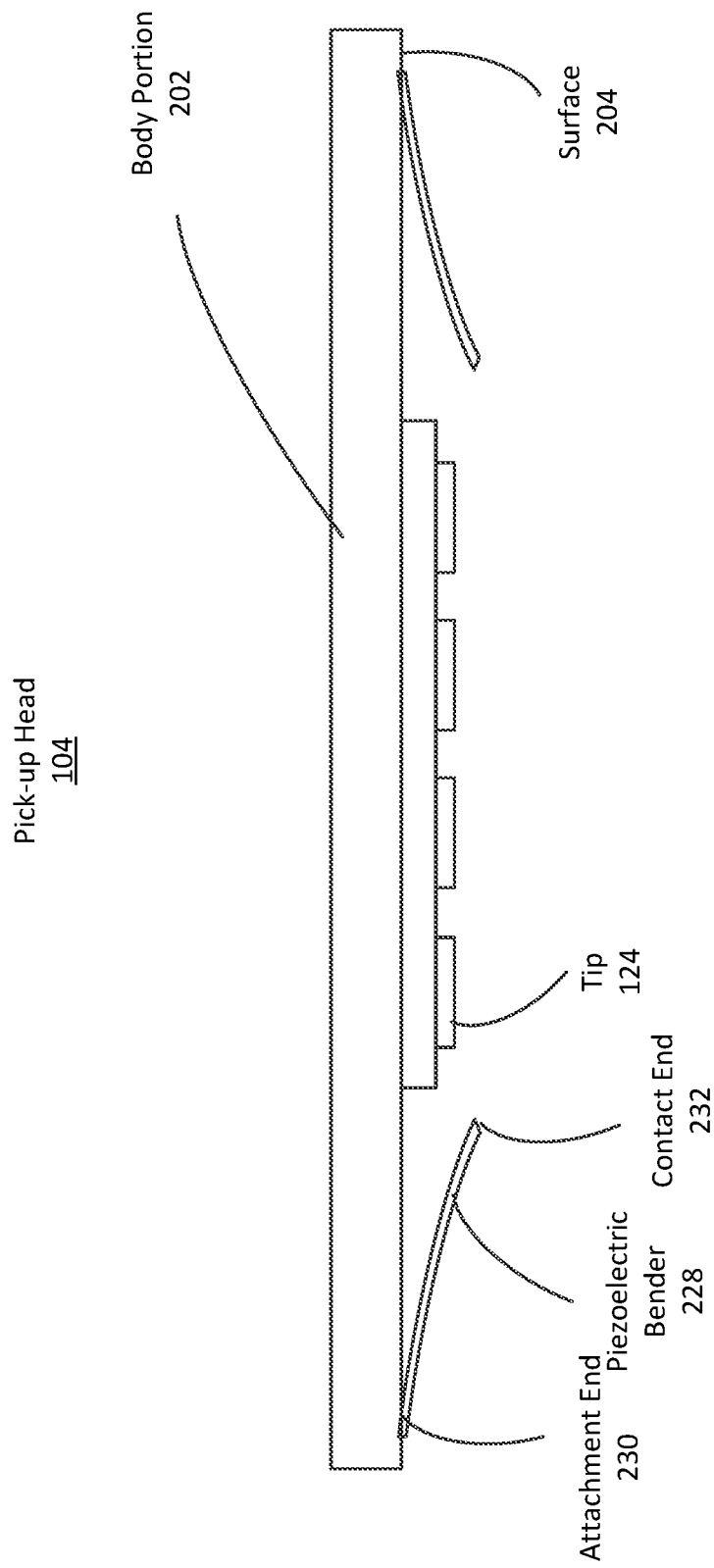
FIG. 2B is a cross sectional side view of the pick-up head taken along the line AA' in FIG. 2A, in accordance with one embodiment.

FIG. 2A is a bottom view of the pick-up head 104 of the display fabrication system 100 and FIG. 2B is a cross sectional side view of the pick-up head 104 taken along the line AA' in FIG. 2A, in accordance with one embodiment. The pick-up head 104 has a body portion 202 defining surface 204, an array of tips 124 at the surface 204, and piezoelectric benders 228 at the surface 204 Here, the touch down sensors 128 are piezoelectric benders 228 that deform in response to contact. The piezoelectric benders 228 have a rest state, and deformation of the piezoelectric benders at variable degrees from the rest state may result in different signal levels that are processed by the controller 106 to adjust the position of the pick-up head 104. In this example, the piezoelectric benders 228 has an attachment end 230 that is attached with the body portion 202, and a contact end 232 that contacts the substrates for orientation detection. The piezoelectric benders 228 have a curvature in the rest state defined from the attachment end 230 and the contact end 232, and deforms in a contact state where the curvature is reduced in response to contact at the contact end 232. In another example, the piezoelectric bender may be unbent in the rest state and may bend in contact states.

The pick-up head 104 may include, among other components, four piezoelectric benders 228 spaced apart on the surface 204. For example, the piezoelectric benders 228 may be positioned at the corners or edges of the surface 204. The relative positions of the tips 124 and the piezoelectric benders 228 correspond with positions of semiconductor devices, target locations, and touch down posts 132 on the carrier and target substrates. A pick-up head is not limited to four touch down sensors, and may include one or more touch down sensors in various embodiments.

Figure 3:
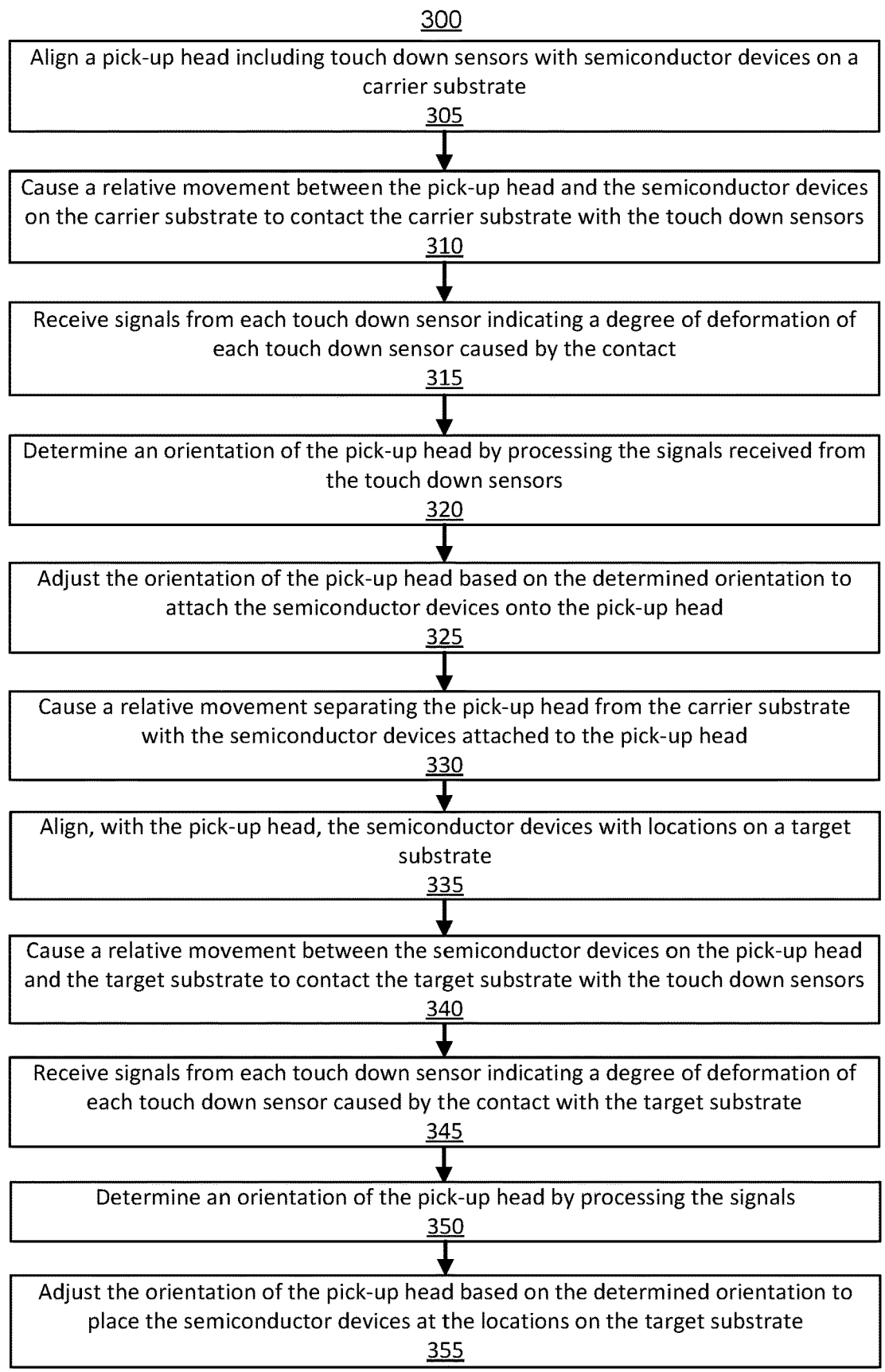
FIG. 3 is a flowchart illustrating a process for picking and placing a semiconductor device with a pick-up head including touch down sensors, in accordance with one embodiment.

FIG. 3 is a flowchart illustrating a process 300 picking and placing a semiconductor device with a pick-up head including touch down sensors, in accordance with one embodiment. Process 400 can be performed by the system 100 to transfer semiconductor devices 112, such as mLEDs or VCSELs, from a carrier substrate 114 to a target substrate 118. Process 400 is discussed with reference to FIGS. 4A, 4B, 4C, 4D, 4E, 4F, and 4G, showing schematic diagrams illustrating the picking and placing of a semiconductor device 112 with the pick-up head 104, in accordance with one embodiment. In some embodiments, the carrier substrate 114 is a carrier film and the target substrate is an intermediate carrier substrate that facilitates placement of semiconductor devices 112 to a target display substrate. In other embodiments, the target substrate 118 is the display substrate, or other final substrate to which the semiconductor devices 112 are placed and bonded.

Figure 4B:
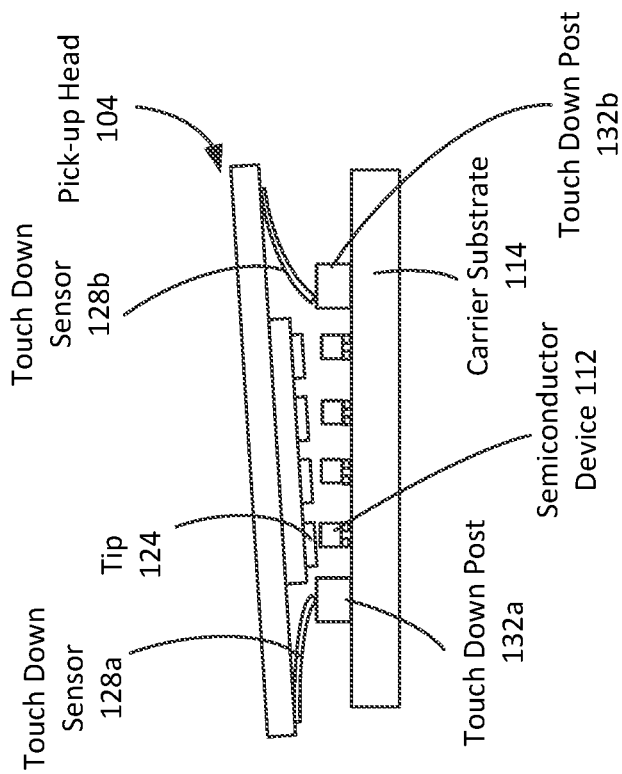
FIGS. 4A, 4B, 4C, 4D, 4E, 4F, and 4G are schematic diagrams illustrating the picking and placing of a semiconductor device with a pick-up head, in accordance with one embodiment.
Figure 4A:
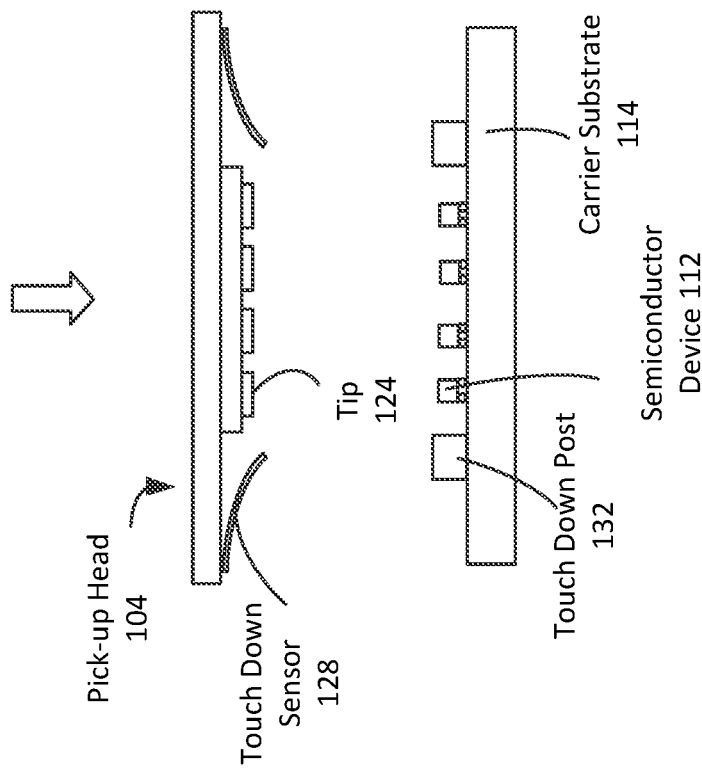

The controller 106 aligns 305 a pick-up head 104 including touch down sensors 128 with semiconductor devices 112 on a carrier substrate 114. For example, the controller 106 controls the actuator 122 to move the pick-up head 104 over the semiconductor devices 112 and the carrier substrate 114 such that the tips 124 of the pick-up head 104 are aligned with the semiconductor devices 112 and the touch down sensors 128 are aligned with touch down posts 132 on the carrier substrate 114. With reference to FIG. 4A, the controller 106 performs an initial alignment using images of the pick-up head 104 to place the tips 124 over the semiconductor devices 112 and the touch down sensors 128 over the touch down posts 132.

The controller 106 causes 310 a relative movement between the pick-up head 104 and the semiconductor devices 112 on the carrier substrate 114 to contact the carrier substrate 114 with the touch down sensors 128. As discussed above, the pick-up head 104 may be moved toward the carrier substrate 114 and/or the carrier substrate 114 may be moved toward the pick-up head 104.

The relative movement results in the pick-up head 104 being positioned closer to the carrier substrate 114 until one or more of the touch down sensors 128 make contact with the carrier substrate 114, such as a touch down post 132 of the carrier substrate 114.

The controller 106 receives 315 signals from each touch down sensor 128 indicating a degree of deformation of each touch down sensor 128 caused by the contact. With reference to FIG. 4B, the touch down sensor 128a contacts the touch down post 132a and the touch down sensor 128b contacts the touch down post 132b. Because orientation of the pick-up head 104 is not aligned with the carrier substrate 114, the touch down sensor 128a deforms more than the touch down sensor 128b. The touch down sensors 128b generate different signals that indicate different degrees of deformation.

The controller 106 determines 320 an orientation of the pick-up head 104 by processing the signals received from the touch down sensors 128. The differences in the signals from the touch down sensors 128 indicate different degrees of deformation which can be used to determine the orientation of the pick-up head 104. In particular, the differences in the signal levels from the touch down sensors 128 can be used to calculate that the orientation of the pick-up head 104 with reference to a desired reference orientation where each of the signal levels are the same from each touch down sensor 128. In another example, the differences in the signal levels can be used to calculate displacement along one or more of six degrees of freedom that results in the desired orientation. In some embodiments, the controller 106 performs an initial calibration prior to the pick and place operation for the pick-up head 104 to determine signal levels of the touch down sensors 128 that correspond with the desired reference orientation, and uses the calibrated values to determine the displacement along adjustable degrees of freedom.

Figure 4C:
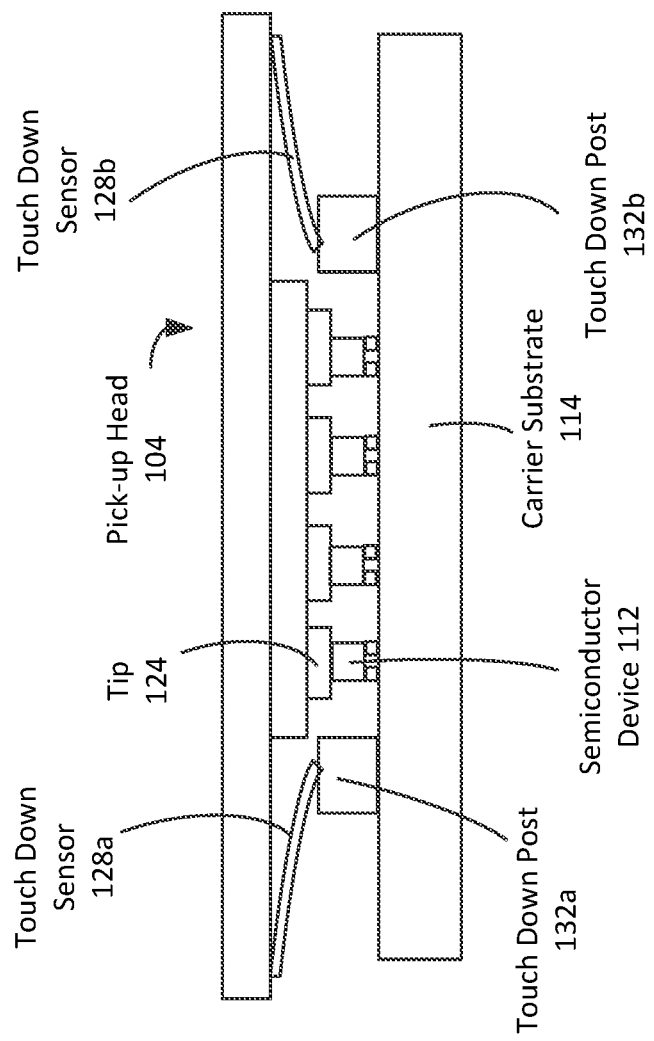

The controller 106 adjusts 325 the orientation of the pick-up head 104 based on the determined orientation to attach the semiconductor devices 112 onto the pick-up head 104. For example, the controller 106 generates the motion parameters and uses the actuator 122 or carrier stage 116 to adjust the orientation of the pick-up head 104 according to the motion parameters. With reference to FIG. 4C, the orientation of the pick-up head 104 is adjusted until there is proper and accurate alignment with the touch down posts 132 and the semiconductor devices 112. The adjusted orientation may result in the touch down sensors 128 each having substantially the same degree of deformation. In some embodiments, the touch down sensors 128 are used for fine positional adjustment for rotational roll, pitch, and yaw during the pickup process.

In some embodiments, the pick-up head 104 selectively picks an array of semiconductor devices 112 from the carrier substrate 114, where the selected array is a subset of all the semiconductor devices 112 on the carrier substrate 114. Various types of tips 124 may be used to provide the selectable attachment. The fine orientation adjustment of the pick-up head 104 ensures that each of the selected semiconductor devices 112 of the array can be picked up without damaging any of the semiconductor devices 112 on the carrier substrate 114.

The controller 106 causes 330 a relative movement separating the pick-up head 104 from the carrier substrate 114 with the semiconductor devices 112 attached to the pick-up head 104.

Figure 4E:
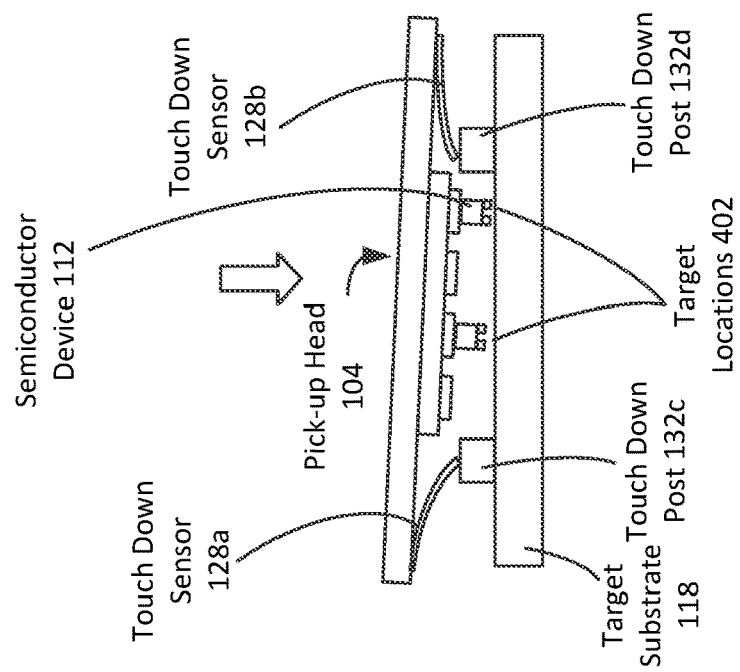
Figure 4D:
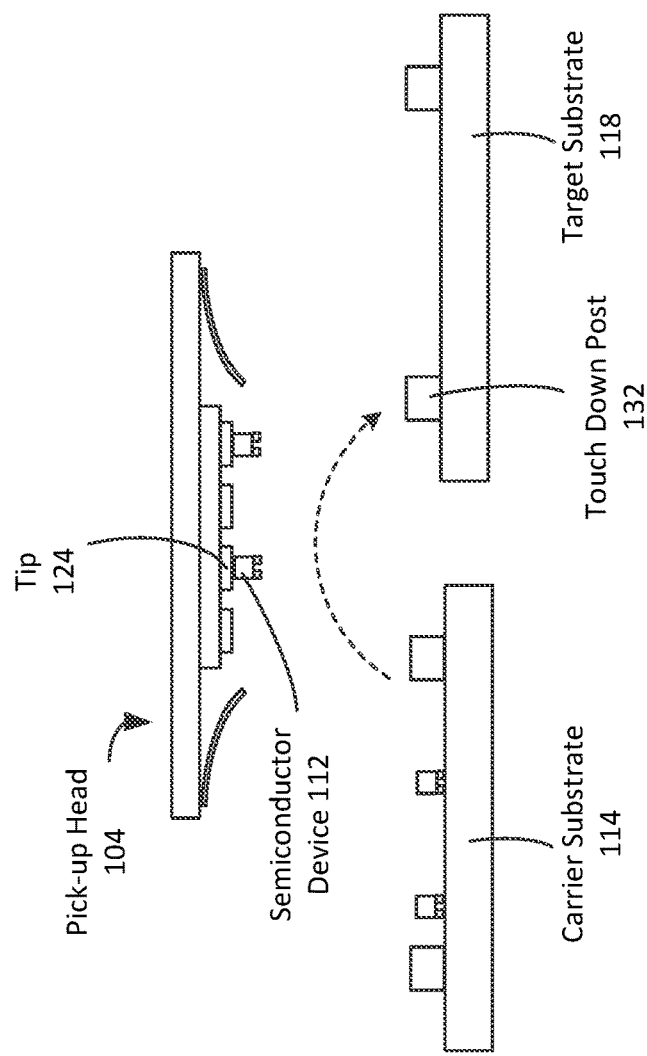

The controller 106 aligns 335, with the pick-up head 104, the semiconductor devices 112 with locations on a target substrate 118. With reference to FIG. 4D, the pick-up head 104 is separated from the carrier substrate 114 with one or more tips 124 attached to a semiconductor device 112, and used to align the semiconductor devices 112 with target locations 402 on the target substrate 118. Furthermore, the touch down sensors 128 are aligned with corresponding touch down posts 132 of the target substrate 118.

The controller 106 causes 340 a relative movement between the semiconductor devices 112 on the pick-up head and the target substrate 118 to contact the target substrate with the touch down sensors 128.

The controller 106 receives 345 signals from each touch down sensor 128 indicating a degree of deformation of each touch down sensor 128 caused by the contact with the target substrate 118. With reference to FIG. 4E, the touch down sensor 128a contacts the touch down post 132c and the touch down sensor 128b contacts the touch down post 132d. Because orientation of the pick-up head 104 is not aligned with the target substrate 118, the touch down sensor 128b deforms more than the touch down sensor 128a.

The controller 106 determines 350 an orientation of the pick-up head 104 by processing the signals. The differences in the signals from the touch down sensors 128 indicate different degrees of deformation which can be used to determine the orientation of the pick-up head 104.

The controller 106 adjusts 355 the orientation of the pick-up head 104 based on the determined orientation to place the semiconductor devices 112 at the locations on the target substrate 118. For example, the controller 106 generates motion parameters and uses the actuator 122 or carrier stage 116 to adjust the orientation of the pick-up head 104 according to the motion parameters. With reference to FIG. 4F, the orientation of the pick-up head 104 is adjusted until there is proper and accurate alignment between the touch down sensors 128a and 128b and the touch down posts 132c and 132d. This results in the semiconductor devices 112 attached to the pick-up head 104 being aligned with the target locations 402 on the target substrate 118. The adjusted orientation may result in the touch down sensors 128 each having substantially the same degree of deformation. In some embodiments, the touch down sensors 128 are used for fine positional adjustment for rotational roll, pitch, and yaw during the placement process.

Figure 4G:
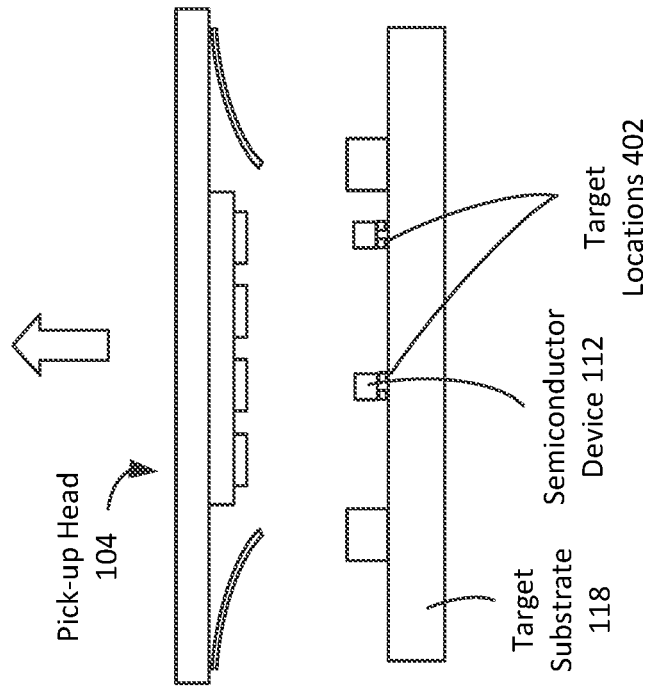
Figure 4F:
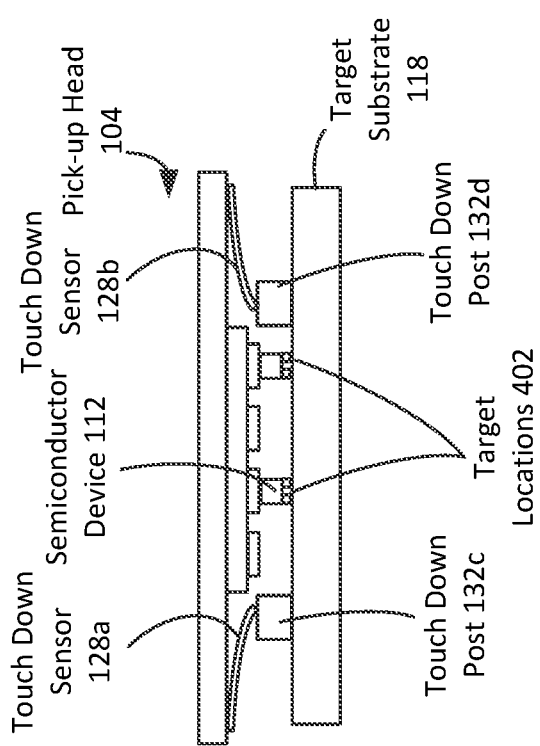

With reference to FIG. 4G, the semiconductor devices 112 remain at the target locations 402 of the target substrate 118, while the pick-up head 104 is separated from the semiconductor devices 112.

The process 300 as illustrated in FIG. 3 is merely illustrative and various changes can be made to the process. For example, the plurality of semiconductor devices 112 picked up at 325 may be placed on a plurality of different target substrates 118 rather than a single target substrate 118. In another example, process 300 can be repeated for different native substrates, where each native substrate has LEDs of different color. In each pick and place cycle, sub-pixels associated with a particular color LED may be placed on the display substrate, and multiple pick and place cycles with different types of LEDs can be used to manufacture each pixel of the electronic display.

Figure 5:
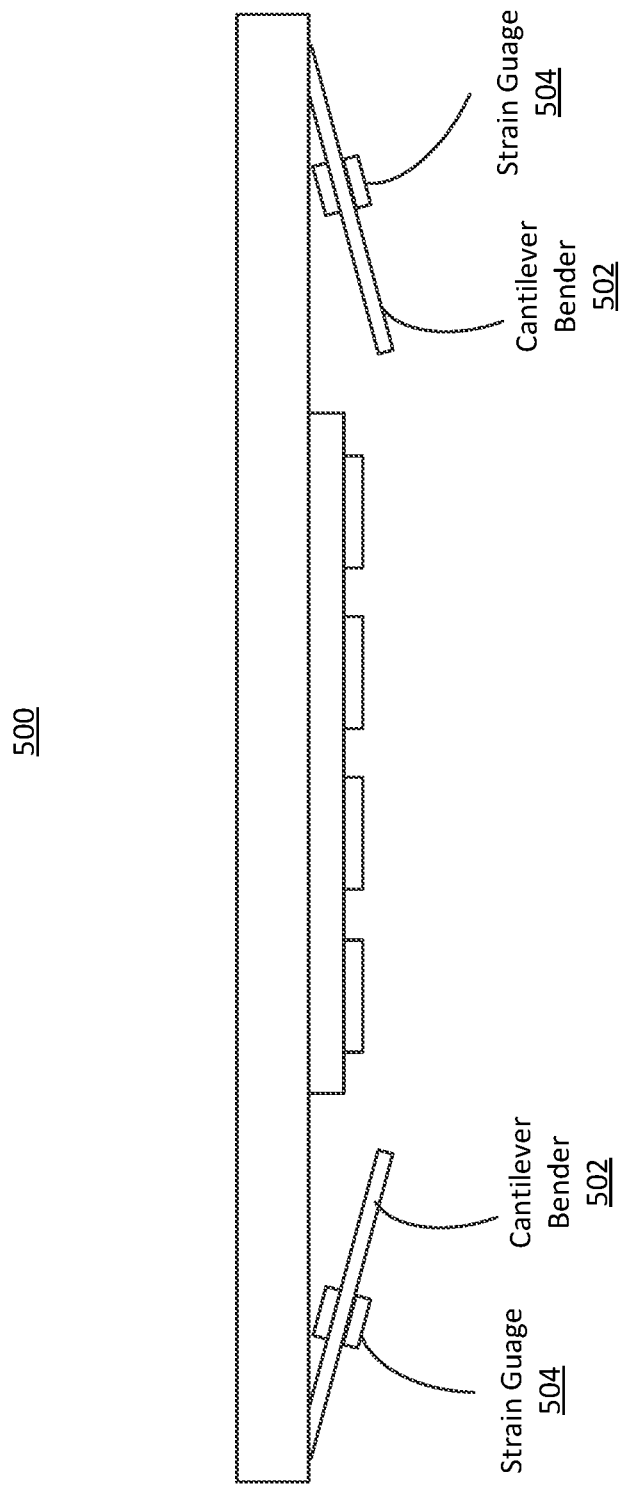
FIG. 5 is a cross sectional side view of a pick-up head including cantilever benders and strain gauges, in accordance with one embodiment.

FIG. 5 is a cross sectional side view of a pick-up head 500 including cantilever benders 502 and strain gauges 504, in accordance with one embodiment. A pick-up head is not limited to piezoelectric benders, and can use other types of touch down sensors 128. In FIG. 5, each touch down sensor includes a cantilever bender 502 and a strain gauge 504 mechanically coupled to the cantilever bender 502. When the cantilever bender 502 is brought into contact with a touch down post or the like, the cantilever bender 502 deforms. The strain gauge 504 detects the degree of deformation, and generates signals for the controller 106 according to the degree of deformation of the cantilever bender 502. In another embodiment instead of a piezo-bender and a strain gauge, passive cantilevers in combination with laser-interferometer can be used to measure the displacement of the cantilevers. By calibration the displacement of the cantilevers to their spring-constant, the cantilevers can act as force sensors as well.

Figure 6:
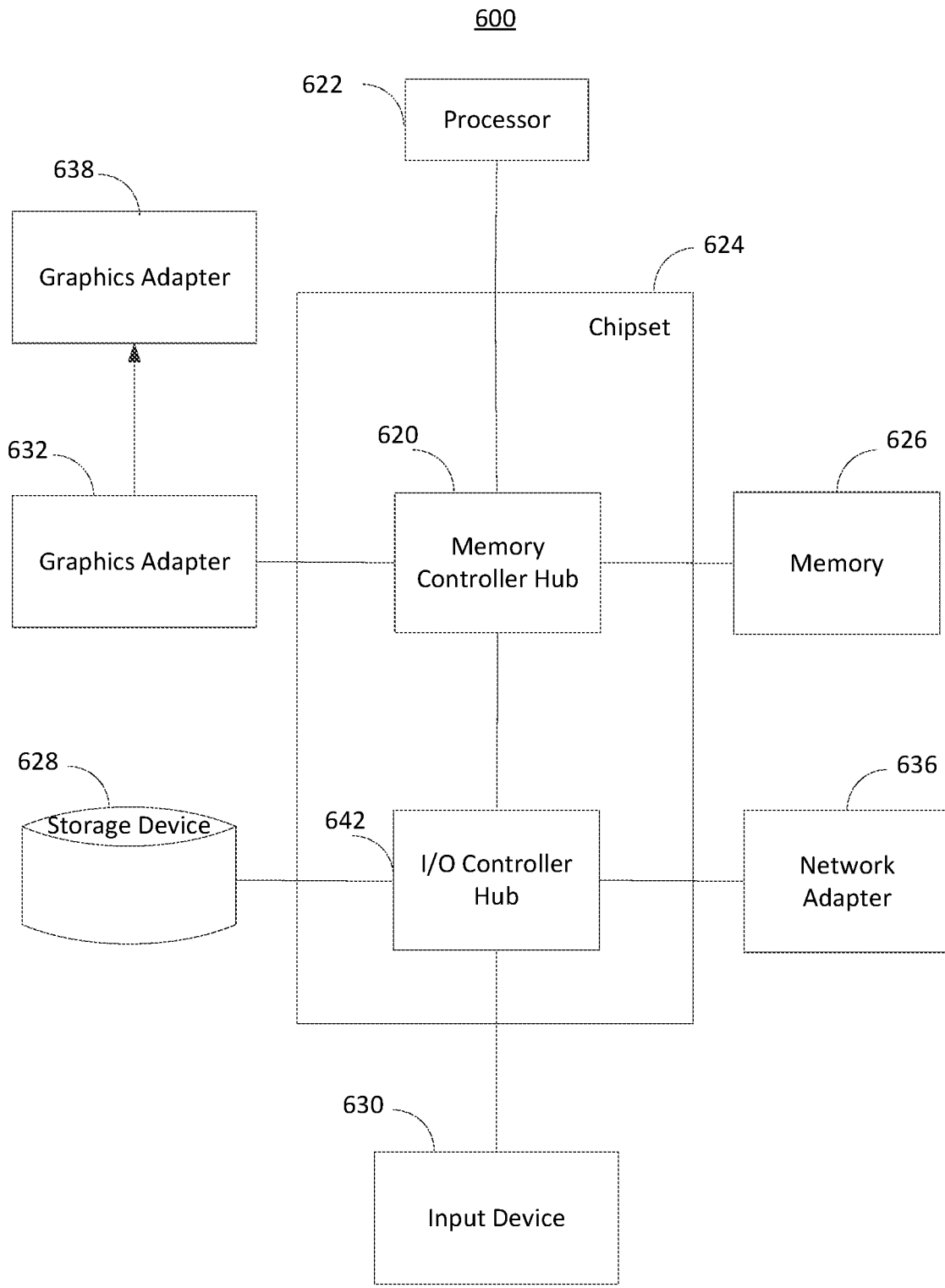
FIG. 6 is a high-level block diagram illustrating an example of a computer for use in the system of FIG. 1, in accordance with one embodiment.

FIG. 6 is a high-level block diagram illustrating an example of a computer 600 for use in the system 100 of FIG. 1, in accordance with one embodiment. In some embodiments, the controller 106 is a circuitry of the computer 600 including at least one processor 622 coupled to a chipset 624. The chipset 624 includes a memory controller hub 640 and an input/output (I/O) controller hub 642. A memory 626 and a graphics adapter 632 are coupled to the memory controller hub 640, and a display device 638 is coupled to the graphics adapter 632. A storage device 628, input device 630, and network adapter 636 are coupled to the I/O controller hub 642. Other embodiments of the computer 600 have different architectures. For example, the memory 626 is directly coupled to the processor 622 in some embodiments. The input device 630 coupled to the I/O controller hub 642 may include various input devices such as a touch screen, keyboard, mouse, etc.

The storage device 628 includes one or more non-transitory computer-readable storage media such as a hard drive, compact disk read-only memory (CD-ROM), DVD, or a solid-state memory device. The memory 626 holds instructions and data used by the processor 622 to configure to processor 622 to control components of the system 100 as discussed herein. The input device 630 can be used to input data into the computer 600. The graphics adapter 632 displays images and other information on the display device 638. In some embodiments, the display device 638 is integrated with a touch screen for receiving user input and selections. The network adapter 636 couples the computer 600 to a network. Some embodiments of the computer 600 have different and/or other components than those shown in FIG. 6.

The computer 600 includes circuitry adapted to execute computer program modules for providing functionality described herein. As used herein, the term "module" refers to computer program instructions and/or other logic used to provide the specified functionality. Thus, a module can be implemented in hardware, firmware, and/or software. In one embodiment, program modules formed of executable computer program instructions are stored on the storage device 628, loaded into the memory 626, and executed by the processor 622.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method, comprising:
   aligning a pick-up head with semiconductor devices on a carrier substrate, the pick-up head including touch down sensors at a surface of the pick-up head facing the carrier substrate and an array of tips on the surface, the array of tips configured to attach with the semiconductor devices;
   causing a first relative movement between the pick-up head and the semiconductor devices on the carrier substrate to contact the carrier substrate with the touch down sensors;
   receiving signals from each touch down sensor indicating a degree of deformation of each touch down sensor caused by the contact with the carrier substrate;
   determining an orientation of the pick-up head by processing the signals;
   adjusting the orientation of the pick-up head based on the determined orientation to attach the semiconductor devices onto the pick-up head; and
   causing a second relative movement separating the pick-up head from the carrier substrate with the semiconductor devices attached to the pick-up head.

2. The method of claim 1, wherein:
   aligning the pick-up head with the semiconductor devices on the carrier substrate further includes aligning each of the touch down sensors with a touch down post of the carrier substrate; and
   causing the first relative movement between the pick-up head and the semiconductor devices on the carrier substrate to contact the carrier substrate with the touch down sensors includes contacting each of the touch down sensors with an aligned touch down post.

3. The method of claim 1, further comprising:
   aligning, with the pick-up head, the semiconductor devices with locations on a target substrate;
   causing a third relative movement between the semiconductor devices on the pick-up head and the target substrate to contact the target substrate with the touch down sensors;
   receiving second signals from each touch down sensor indicating a second degree of deformation of each touch down sensor caused by the contact with the target substrate;
   determining a second orientation of the pick-up head by processing the second signals; and
   adjusting the orientation of the pick-up head based on the determined second orientation to place the semiconductor devices at the locations on the target substrate.

4. The method of claim 3, wherein:
   aligning, with the pick-up head, the semiconductor devices with the locations on a target substrate includes aligning each of the touch down sensors with a touch down post of the target substrate; and
   causing the third relative movement between the semiconductor devices on the pick-up head and the target substrate to contact the target substrate with the touch down sensors includes contacting each of the touch down sensors with an aligned touch down post.

5. The method of claim 1, wherein:
   determining the orientation of the pick-up head includes determining parameters for a plurality of degrees of freedom, and
   adjusting the orientation of the pick-up head includes adjusting the pick-up head along at least one of the plurality of degrees of freedom to align the array of tips of the pick-up head with the semiconductor devices.

6. The method of claim 5, wherein the parameters for the plurality of degrees of freedom include at least one of a surge parameter, a heave parameter, a sway parameter, a yaw parameter, a pitch parameter, and a roll parameter.

7. The method of claim 1, wherein:
   each touch down sensor is a piezoelectric bender including a first end attached with the surface of the pick-up head and a second end that contacts the carrier substrate; and
   causing the first relative movement between the pick-up head and the semiconductor devices on the carrier substrate to contact the carrier substrate with the touch down sensors includes bending the second end of each piezoelectric bender towards the surface of the pick-up head.

8. The method of claim 7, wherein:
   in a rest state, each piezoelectric bender a curvature; and
   in a contact state caused by the contact with the carrier substrate, the curvature of each piezoelectric bender is reduced.

9. The method of claim 1, wherein each touch down sensor includes a cantilever bender and a strain gauge, the strain gauge generating the signal for each touch down sensor based on an amount of bending of each cantilever bender caused by the contact.

10. The method of claim 1, wherein each touch down sensor includes a passive cantilever and a laser-interferometer to measure displacement of the passive cantilever.

11. A system, comprising:
    a pick-up head, including:
       a body portion defining a surface;
       an array of tips on the surface, the array of tips configured to attach with semiconductor devices on a carrier substrate; and
       touch down sensors on the surface and configured to deform in response to a contact; and
    a controller having a memory, a processor coupled to the memory, and an interface coupled to the processor and communicating with the touch down sensors, the processor executing instructions to:

receive signals from each touch down sensor indicating a degree of deformation caused by the contact;

determine an orientation of the pick-up head by processing the signals;

adjust the orientation of the pick-up head based on the determined orientation to attach the semiconductor devices onto the pick-up head; and cause a second relative movement separating the pick-up head from the carrier substrate with the semiconductor devices attached to the pick-up head.

12. The system of claim 11, wherein:

the processor executing the instructions to align the pick-up head with the semiconductor devices on the carrier substrate further includes the processor aligning each of the touch down sensors with a touch down post of the carrier substrate; and the processor executing the instructions to cause the first relative movement between the pick-up head and the semiconductor devices on the carrier substrate to contact the carrier substrate with the touch down sensors includes the processor causing each of the touch down sensors to contact an aligned touch down post.

13. The system of claim 11, wherein the processor executes the instructions to:

align, with the pick-up head, the semiconductor devices with locations on a target substrate;

cause a third relative movement between the semiconductor devices on the pick-up head and the target substrate to contact the target substrate with the touch down sensors;

receive second signals from each touch down sensor indicating a second degree of deformation of each touch down sensor caused by the contact with the target substrate;

determine a second orientation of the pick-up head by processing the second signals; and adjust the orientation of the pick-up head based on the determined second orientation to place the semiconductor devices at the locations on the target substrate.

14. The system of claim 13, wherein:

the processor executing the instructions to align, with the pick-up head, the semiconductor devices with the locations on a target substrate includes the processor aligning each of the touch down sensors with a touch down post of the target substrate; and the processor executing the instructions to cause the third relative movement between the semiconductor devices on the pick-up head and the target substrate to contact the target substrate with the touch down sensors includes the processor causing each of the touch down sensors to contact with an aligned touch down post.

15. The system of claim 11, wherein:

the processor executing the instructions to determine the orientation of the pick-up head includes the processor determining parameters for a plurality of degrees of freedom, and the processor executing the instructions to adjust the orientation of the pick-up head includes the processor adjusting the pick-up head along at least one of the plurality of degrees of freedom to align an array of tips of the pick-up head with the semiconductor devices.

16. The system of claim 15, wherein the parameters for the plurality of degrees of freedom include at least one of a surge parameter, a heave parameter, a sway parameter, a yaw parameter, a pitch parameter, and a roll parameter.

17. The system of claim 11, wherein:

each touch down sensor is a piezoelectric bender including a first end attached with the surface of the pick-up head and a second end that contacts the carrier substrate; and the processor executing the instructions to cause the first relative movement between the pick-up head and the semiconductor devices on the carrier substrate to contact the carrier substrate with the touch down sensors includes the processor causing the second end of each piezoelectric bender to bend towards the surface of the pick-up head.

18. The system of claim 17, wherein:

in a rest state, each piezoelectric bender a curvature; and in a contact state caused by the contact with the carrier substrate, the curvature of each piezoelectric bender is reduced.

19. The system of claim 11, wherein each touch down sensor includes a cantilever bender and a strain gauge, the strain gauge generating the signal for each touch down sensor based on an amount of bending of each cantilever bender caused by the contact.

20. The system of claim 11, wherein each touch down sensor includes a passive cantilever and a laser-interferometer to measure displacement of the passive cantilever.

* * * * *